United States Patent
Wu et al.

(10) Patent No.: US 8,009,459 B2
(45) Date of Patent: Aug. 30, 2011

(54) CIRCUIT FOR HIGH SPEED DYNAMIC MEMORY

(75) Inventors: Cheng-Hsu Wu, Chu-Tung Town (TW); David Yen, Chu-Bak (TW); Tsai-Hsin Lai, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 101 days.

(21) Appl. No.: 12/346,173

(22) Filed: Dec. 30, 2008

(65) Prior Publication Data
US 2010/0165704 A1 Jul. 1, 2010

(51) Int. Cl.
*G11C 11/24* (2006.01)
(52) U.S. Cl. .......................... 365/149; 365/145
(58) Field of Classification Search ............. 365/145 X, 365/149 O, 145, 149
See application file for complete search history.

(56) References Cited

U.S. PATENT DOCUMENTS

| | | | |
|---|---|---|---|
| 3,387,286 A | | 6/1968 | Dennard |
| 4,935,896 A | * | 6/1990 | Matsumura et al. .......... 365/187 |
| 5,646,903 A | * | 7/1997 | Johnson ................... 365/230.05 |
| 6,101,117 A | * | 8/2000 | Tiwari ............................ 365/145 |
| 6,314,017 B1 | * | 11/2001 | Emori et al. .................. 365/149 |
| 6,804,142 B2 | * | 10/2004 | Forbes .......................... 365/149 |
| 6,982,897 B2 | * | 1/2006 | Luk et al. ...................... 365/149 |
| 7,016,234 B2 | * | 3/2006 | Ishida et al. ............. 365/189.16 |
| 7,440,334 B2 | * | 10/2008 | Barth et al. ................... 365/188 |

OTHER PUBLICATIONS

Ekanayake, V. N., et al.; "Asynchronous DRAM Design and Synthesis"; IEEE Asynchronous Circuits and Systems, 2003 Proceedings, Ninth International Symposium, May 12-15, 2003, pp. 174-183.

* cited by examiner

*Primary Examiner* — VanThu Nguyen
(74) *Attorney, Agent, or Firm* — Slater & Matsil, L.L.P.

(57) ABSTRACT

A memory cell includes a write access transistor coupled between a storage node and a write bit line, and active during a write cycle responsive to a voltage on a write word line; a read access transistor coupled between a read word line and a read bit line, and active during a read cycle responsive to a voltage at the storage node; and a storage capacitor coupled between the read word line and the storage node. Methods for operating the memory cell are also disclosed.

20 Claims, 7 Drawing Sheets

Evaluate capacitor charge condition simulation result in 125C

| Capacitor | | 20ns | 140ns | Storage node voltage in hold state(No refresh) 400ns | 999990ns | Storage node voltage in Read st 507.7ns | 1ms |
|---|---|---|---|---|---|---|---|
| 0.5ff | Storage node | 853.4(mV) | 806.6(mV) | 802(mV) | 279.4(mV) | 1.67V | 1.12V |
| | Read 1 BL(RBL) Voltage | | | | | 952.1(mV) | 717.3(mV) |
| 1ff | Storage node | 820.2(mV) | 760.2(mV) | 757.2(mV) | 356.1(mV) | 1.57V | 1.29V |
| | Read 1 BL(RBL) Voltage | | | | | 936.1(mV) | 858.9(mV) |
| 1.5ff | Storage node | 731.7(mV) | 731.3(mV) | 730.7(mV) | 402.6(mV) | 1.65V | 1.36V |
| | Read 1 BL(RBL) Voltage | | | | | 934.7(mV) | 902.4(mV) |
| 2ff | Storage node | 788.1(mV) | 718.3(mV) | 715.5(mV) | 435.8(mV) | 1.65V | 1.33V |
| | Read 1 BL(RBL) Voltage | | | | | 946.6(mV) | 946.2(mV) |
| 3ff | Storage node | 764.2(mV) | 689.9(mV) | 687.2(mV) | 472.6(mV) | 1.64V | 1.45V |
| | Read 1 BL(RBL) Voltage | | | | | 943.9(mV) | 1.01V |

Figure 7

CIRCUIT FOR HIGH SPEED DYNAMIC MEMORY

TECHNICAL FIELD

The present invention relates to a circuit and method for providing an improved dynamic memory cell for use in memory circuits.

BACKGROUND

Highly integrated semiconductor circuits are increasingly important, particularly in producing battery operated devices such as cell phones, portable computers such as laptops, notebook computers and PDAs, wireless email terminals, MP3 audio and video players, portable wireless web browsers and the like, and these sophisticated integrated circuits increasingly include on-board data storage.

As is known in the art, such data storage may take the form of dynamic memory cells in which arrays of capacitive storage memory cells are provided. In the conventional dynamic memory devices of most current integrated circuits, a one transistor-one capacitor (1T1C) memory cell is frequently employed, each memory cell having an access transistor and a capacitor. Data stored in such memory cells is actually a charge stored on the small capacitor, and the data is typically accessed by outputting the stored charge to a bit line, which is then coupled to a sense amplifier. The data is output when the access transistor is activated, typically by a word line coupled to the gate or control terminal of the transistor. Sense amplifiers coupled to the bit lines are typically differential sense amplifiers. The input and output lines coupled from the memory cells to the memory array sense amplifier are typically referred to as bit lines or column lines. The sense amplifier operates by receiving a small differential voltage, typically on the order of 200 millivolts for current process technology DRAMs, on one of the bit lines, while the other bit line remains at, or is coupled to, a reference voltage. The small differential voltage between the pairs of bit lines is sensed by the sense amplifier and then amplified to a larger voltage that additional circuitry can receive, for example VDD or VSS.

To enable large arrays of memory cells to be used in implementing a typical memory device, pairs of global bit lines coupled to a latching sense amplifier are often routed though the memory array, while pairs of local bit lines for transmitting and receiving read and write data to and from the global bit lines are formed in columns in sub-arrays, the local bit lines are usually arranged as columns coupled to rows of memory cells. The global bit lines may also be coupled to an input/output circuit that transfers the memory array data to and from other circuits. Because the voltages developed at the bit lines by the conventional dynamic memory cell are quite small, a plurality of sense amplifiers, and local and global bit lines, are required to correctly deliver the data out of the memory cells. The memory cells output data by a charge sharing mechanism, which slowly transfers charge from the storage capacitor onto the selected bit line. The memory cell must be "written back" to restore the small stored charge at the end of each read cycle, because the storage capacitor discharges onto the bit line, the read is a destructive read out.

Dynamic memory cells may be used in stand alone, or commodity, memory devices such as DRAM integrated circuits. These ICs are usually supplied in the form of cards populated with several commodity DRAM integrated circuits to make a complete array of memory, for example so called SIMM or DIMM cards. These cards are then provided as a finished memory product for a desktop or laptop computer. Increasingly embedded dynamic memory is becoming important in the production of advanced integrated circuits. These embedded memory modules may be a portion of an integrated circuit that provides an entire system in one IC, so-called system on a chip (SOC) or system on integrated circuit (SOIC) devices. These SOC devices may provide, for example, all of the circuitry needed to implement a cell phone, or a personal data assistant (PDA), digital VCR, digital camcorder, digital camera, MP3 player, or the like in a single integrated circuit. The embedded memory arrays used in such devices must be very space efficient, must be very power efficient, reliable and must be compatible with semiconductor processes that form logic circuitry and other types of circuitry on board the same integrated device. Typically the embedded dynamic memory in such integrated circuits is referred to as e-DRAM.

The charge sharing mechanism used by conventional DRAM cell accesses causes reads of the memory cell to be destructive, and requires a write back cycle after a read, lengthening the time required for each read cycle. The cells require large capacitors and frequent refresh cycles, which reduce memory density and slow access times. A need thus exists for improved DRAM memory devices.

SUMMARY OF THE INVENTION

These and other problems are generally solved or circumvented, and technical advantages are generally achieved, by embodiments of the present invention, which provides circuits and methods to improve the operation of sense amplifiers and the voltage references used with the sense amplifiers without requiring a dummy cells or added write select signals to enable high speed sense amplifier operations.

In one embodiment, a memory cell is provided comprising a write access transistor coupled between a storage node and a write bit line, and active during a write cycle responsive to a voltage on a write word line; a read access transistor coupled between a read word line and a read bit line, and active during a read cycle responsive to a voltage at the storage node; and a storage capacitor coupled between the read word line and the storage node.

In another preferred embodiment, a dynamic memory array comprises a plurality of dynamic memory cells arranged in rows and columns, each dynamic memory cell coupled to a respective read word line, a respective read bit line, a respective write word line, and a respective write bit line, and each dynamic memory cell further comprising a write access transistor coupled between a storage node and a write bit line, and active during a write cycle responsive to a voltage on a write word line; a read access transistor coupled between a read word line and a read bit line, and active during a read cycle responsive to a voltage at the storage node; and a storage capacitor coupled between the read word line and the storage node.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 7 depicts the results obtained from a circuit simulation performed using example capacitors to illustrate data retention times of memory cells of the exemplary embodiments.

The drawings, schematics and diagrams are illustrative, not intended to be limiting but are examples of embodiments of the invention, are simplified for explanatory purposes, and are not drawn to scale.

DETAILED DESCRIPTION

Figure 1:
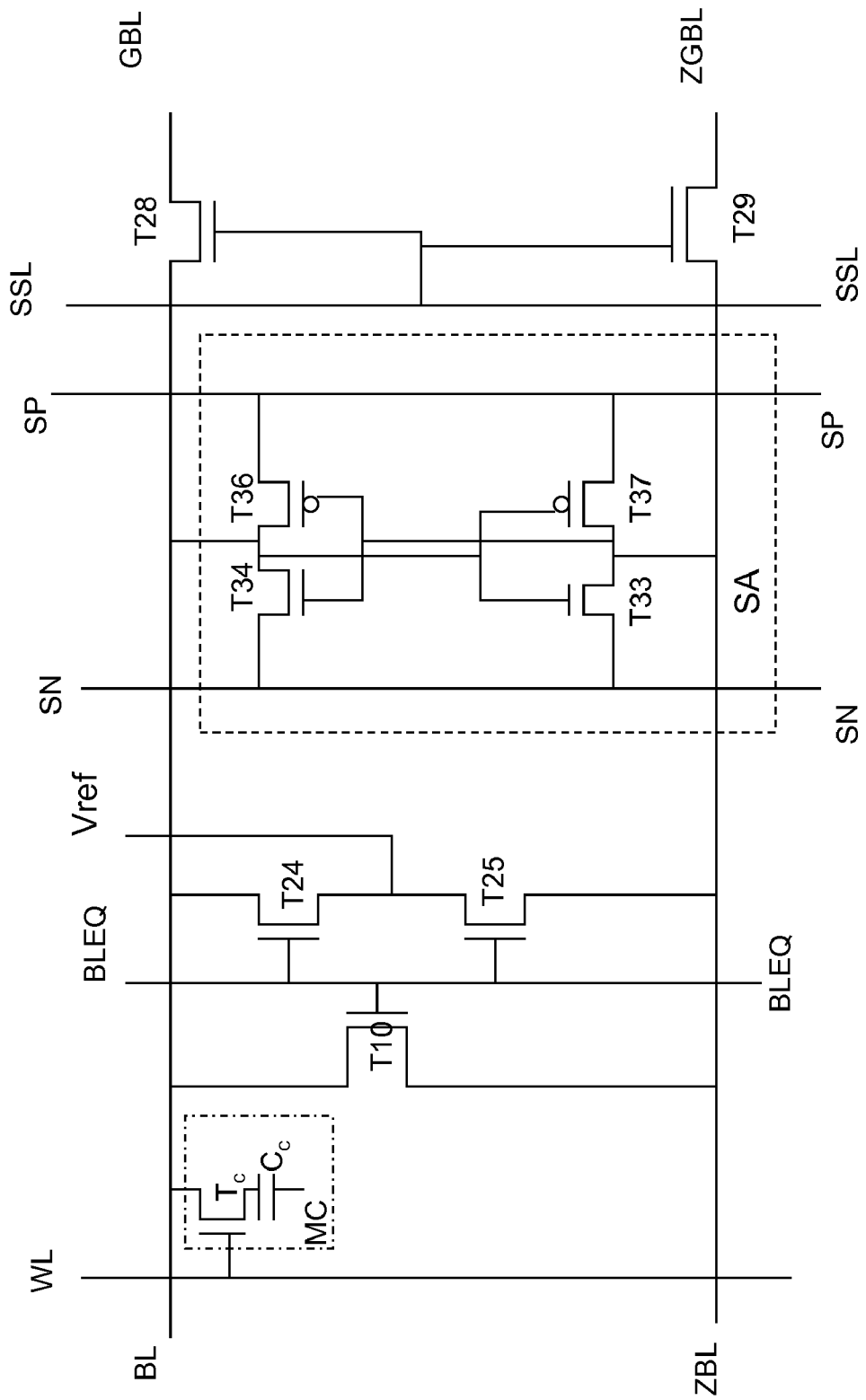
FIG. 1 illustrates a simplified circuit diagram for a portion of prior art memory circuit including a sense amplifier.

FIG. 1 depicts a small portion of a typical dynamic memory circuit of the prior art. Any read of a conventional dynamic memory cell such as the 1T1C cell MC in FIG. 1 is destructive, so the cell is always restored or rewritten at the end of the cycle. A "write" is simply a read cycle with write data impressed on the respective local bit line during the "restore" portion of the cycle. For a write, the read data is replaced or overwritten with the new write data and then written into the cell. Refresh cycles are also performed periodically to overcome loss of charge due to leakage.

In FIG. 1, memory cell MC is coupled at an intersection between a row or word line WL and a column or bit line BL. Although only one memory cell MC is depicted, another cell will be placed at the intersection of each of a plurality of word lines WL and the bit line BL. Similarly, a plurality of memory cells will also be placed at the intersections of each of a plurality of row lines WL (only one of which is depicted in FIG. 1) and the complementary bit line ZBL of FIG. 1. A portion of a memory circuit may have 8, 16, 32, 64, 128 or more columns, typically arranged in word widths, and many word lines or rows typically arranged across the bit lines. Sense amplifier SA is coupled to a pair of local bit lines. Each pair of local bit lines BL and ZBL in the array will be coupled to such a sense amplifier. The bit lines BL and ZBL are each further coupled to the global bit lines GBL and ZBGL through the use of column select control line SSL and column select coupling transistors T28 and T29. In this manner many, many columns of memory cells may be arranged in sub-arrays and selectively coupled to the global bit lines; for a particular memory cycle, one memory cell is coupled to each pair of the global bit lines. The global bit lines are again coupled to another differential sense amplifier (not shown) and the amplified sensed data is then output to I/O lines. The I/O lines will be arranged in a group to form a word of data for each cycle, for example the memory device may be an x8 device with 8 I/O lines forming a word, or X16, X32, X64 and X128 wide devices are known.

Figure 2:
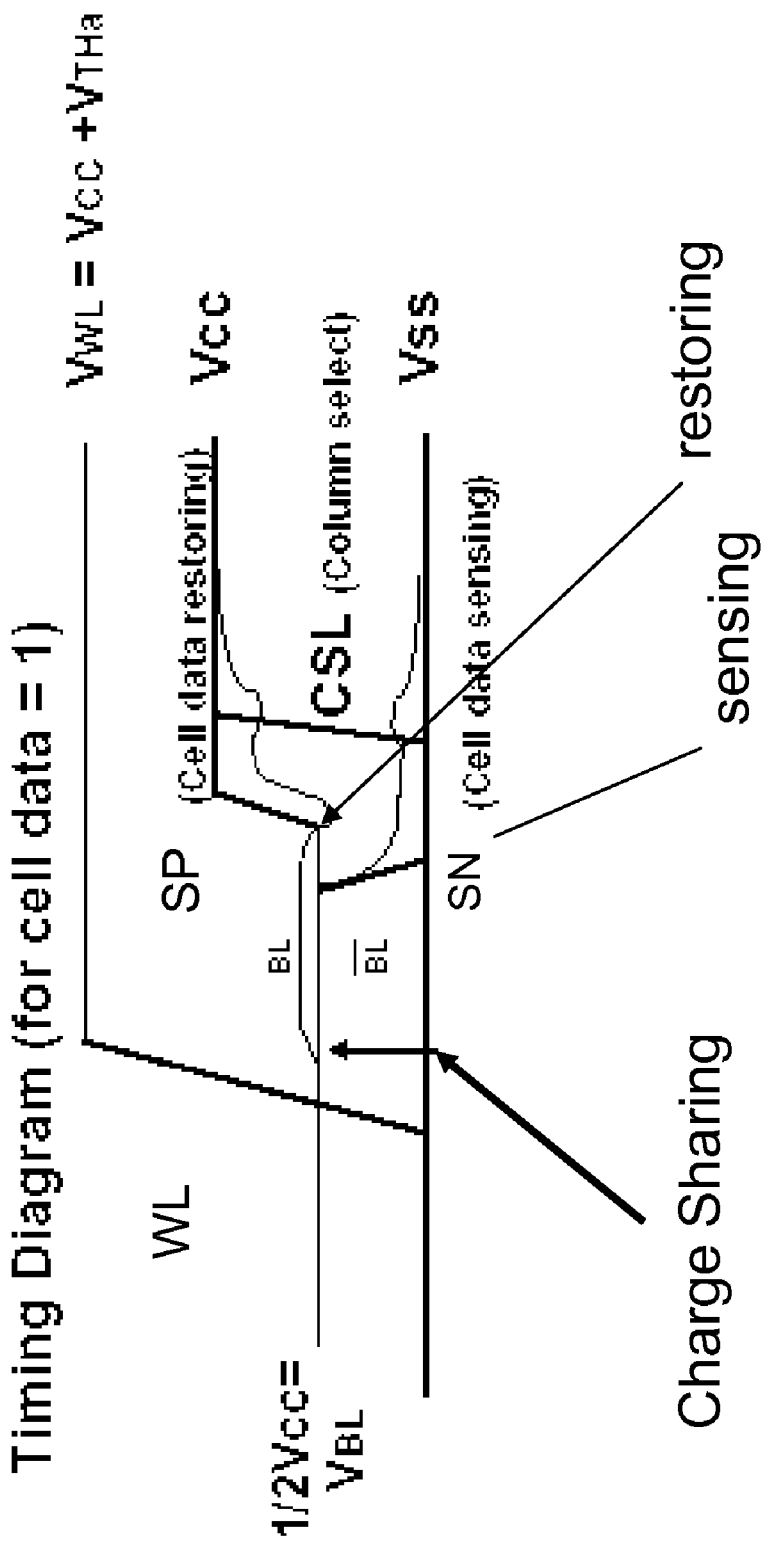
FIG. 2 illustrates a prior art timing diagram for the memory access operation of the circuit of FIG. 1.

The timing of a dynamic memory cycle for the prior art is depicted in FIG. 2. The DRAM memory access cycle begins when the word line WL transitions to a high positive voltage to cause the transistor $T_c$ to couple the capacitor $C_c$ to the bit line BL. A short time after the word line goes active, the access transistor $T_c$ couples the capacitor $C_c$ to the respective bit line, (here BL), and the "charge sharing" portion of the cycle begins. If the stored data in memory cell MC is a logical "1" the storage capacitor will add voltage to the bit line equalization voltage during the charge sharing operation. In response, a small voltage increase $\Delta VBL$ will be seen on the bit line BL, as shown in FIG. 2. If the stored data is a logical "0" the storage capacitor may subtract voltage from the bit line, for example, by charging the capacitor in the memory cell from the bit line BL. These logical data assignments are arbitrary and may be reversed.

Shortly after the "charge sharing" has begun, sensing begins. Control line SN, which is coupled to the two "pull down" N MOS transistors in FIG. 1 labeled T33 and T34, transitions from an equalized voltage of Vdd/2 to a low voltage of approximately Vss. The small differential input voltage from the selected memory cell MC is "sensed" by the sense amplifier SA. In FIG. 2, the unselected bit line ZBL begins falling at this part of the cycle, because the voltage at the gate of transistor T33 is slightly higher than the initial voltage on ZBL, transistor T33 turns on and begins conducting. In contrast, transistor T34 has a voltage on its source terminal of BL plus a delta voltage which is higher than the gate voltage received from bit line ZBL at the beginning of the sense cycle, and thus remains turned off. The voltage on bit line BL remains at the slightly increased voltage, adding a $\Delta VBL$ voltage over the initial voltage Vdd/2.

The prior art memory sensing operation then transitions to the "restore" portion of the cycle shown in FIG. 2. The control signal SP transitions from the initial equalized value to a high potential, for example Vdd. The node coupled to SP rises to a high voltage. Transistor T36 now has the low voltage on bit line ZBL at its gate, and because it is a P MOS transistor, it turns on and couples the bit line BL to a high voltage from SP. This causes the bit line BL potential to increase to a logical "1" high voltage. The transistor T37 remains in cutoff. The two lines BL and ZBL are now at voltages corresponding to a logical '1' and a logical '0' At this point the word line WL is still active. Thus, the high voltage on line BL is also coupled into the memory cell MC and restores the stored charge for future accesses to this memory cell MC. Finally, the read cycle is completed when local bit lines BL and ZBL are coupled to the global bit lines GBL, ZBGL in FIG. 1 by the operation of column select line CSL. The use of the charge sharing in the conventional memory cell does not provide the high speed access times needed for current and future applications. The need for a restore or "write back" portion of each read cycle further lengthens the memory cycle time. The data retention for the 1T1C cell is poor, so that frequent refresh cycles are required. These cycles further delay the access times for data stored in the cells. Further a fairly complex manufacturing process is required to form the large memory cell capacitors needed in these prior art circuits, a 12 femto-farad capacitor or larger may be required.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 3:
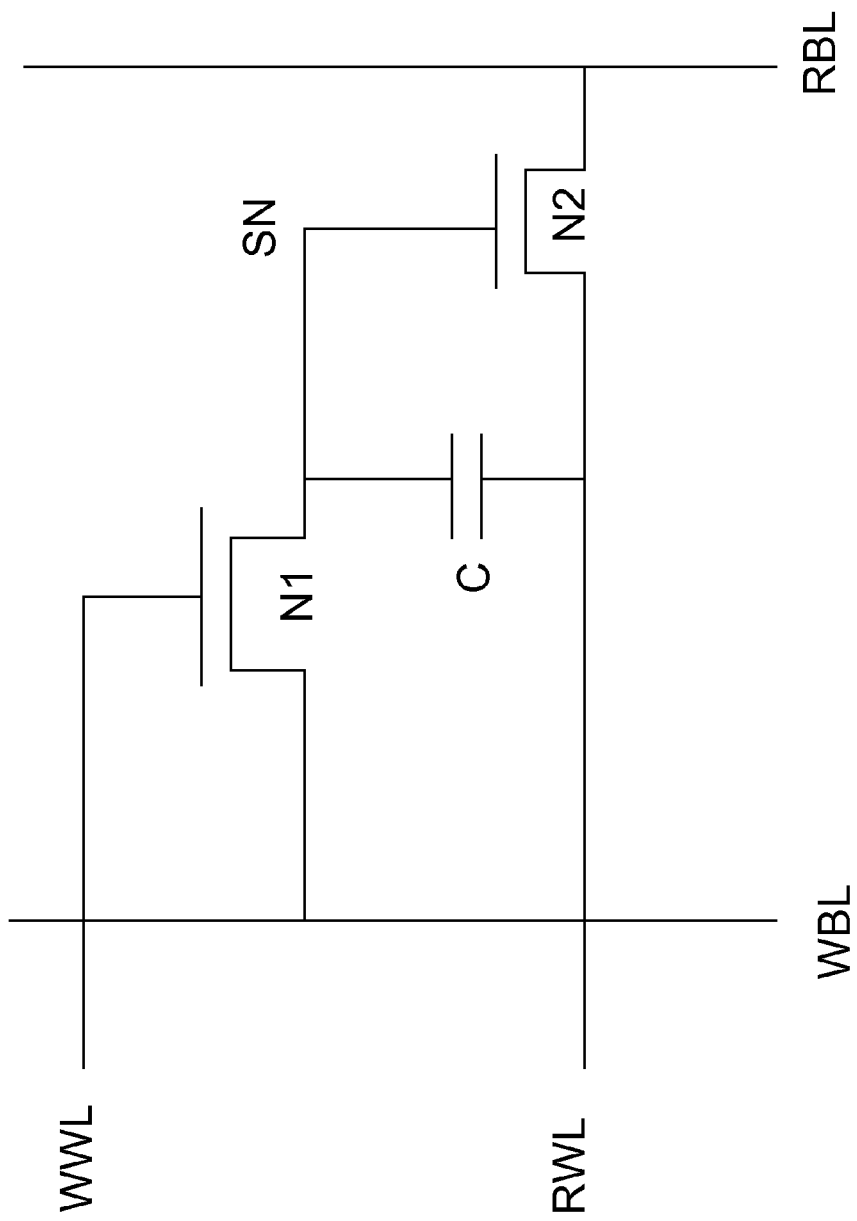
FIG. 3 illustrates a circuit diagram of a first preferred embodiment memory cell of the present invention.

FIG. 3 depicts a circuit diagram for an exemplary embodiment of the invention, an improved memory cell 31. The memory cell uses two access transistors labeled N1 and N2, and a storage capacitor C, and therefore is a 2T1C memory cell. The memory cell is dynamic, yet for reasons explained below, a restore or write back portion of a memory cycle is not needed during read state; and the memory cell exhibits desired data retention, reducing the frequency of refresh cycles required. The capacitor size used and the VDD level used are based on the circuit specification and process parameters. The VDD level and the capacitor size used will define the data retention time. The results from a set of chosen capacitor sizes are presented below in FIG. 7. Relatively small capacitor sizes may be used with good retention times.

In FIG. 3, transistor N1 couples write data from a write bit line WBL to a storage node SN when the write word line WWL is active. Transistor N2 couples read data from the storage node SN to the read bit line RBL when the read word line RWL is active. Capacitor C is coupled not between an access node and a voltage supply, as in the prior art, but instead between the storage node SN and the read word line RWL.

The operations for writing and reading the memory cell 31 are now described. During a write "1", the write word line WWL goes to VDD, turning on N1. The write bit line is raised to VDD (representing a "1", this is an arbitrary design choice, it could represent a logical "0" but for the explanation here, a high voltage stored in the cell corresponds to a "1"). The read word line RWL is at ground, and the read bit line RBL is a "don't care". Capacitor C is charged from the high voltage coupled onto the storage node by active transistor N1 and the low voltage on RWL at the opposite plate of capacitor C.

During a HOLD state, when no action is taking place, the read word line RWL is floating and read bit line RBL is floating or charged from the other cell operations in the same bit line BL, and N2 is off, N1 is off, and the capacitor C maintains its state.

During a read "1" operation, the write word line WWL is low, and N1 is turned off. The read word line RWL is high, and N2 is turned on, the charge in capacitor C will boost the gate of N2 to turn it on, and the read bit line RBL is charged to VDD. In exemplary embodiments, the capacitor C is coupled with the gate of N2 and not directly with the bit line RBL. The read mechanism is not a charge sharing, as in the conventional 1T1C cell, and the charge in capacitor C is not destroyed by the read cycle, thus, there is no need for a write back, or restore cycle, after a read cycle.

The read "1" operation can take advantage of a "boosted" line effect. For example, if a charged capacitor suddenly is switched between a high voltage, here VDD on the read word line RWL, and a gate, here the gate of N2, the gate voltage will be boosted to voltage over VDD. This has an advantage when it is desired to output, on the source terminal of a transistor, a full VDD voltage. If the gate voltage were only at VDD, instead of a boosted voltage, the output voltage on the read bit line RBL would be less than VDD by a transistor threshold voltage Vt. Instead by using the boost effect, in the memory cell 31 a read "1" puts a full VDD on the bit line. This advantageously increases the bit line differential voltage ΔVBL, as compared to the prior art memory cells.

To perform a write "0" operation, the write word line WWL is moved to a high level or VDD, turning on N1, the write bit line is maintained at a low level of VSS, the read word line RWL and read bit line RBL are at ground, N2 is off, and so the storage node SN discharges to the write bit line WBL.

Finally a read "0" operation is performed. In a read "0", the storage capacitor C is discharged. N1 is turned off as the write word line WWL is at zero or VSS. The read word line RWL is high or VDD. Through the capacitor coupling effect, the voltage at the gate of N2 can be raised and N2 turns on. The voltage on the read bit line is now RBL<VDD−Vtn2 (Vtn2 being the threshold voltage of N2) Because the capacitor is not charged, the voltage at the gate of N2 is somewhat less than VDD, since the coupling efficiency of the capacitor is less than 100%, and the voltage from the read word line RWL, which is VDD, is coupled through the transistor N2 to the read bit line. This voltage is then lowered by a transistor drop Vtn2. Thus, the minimum difference voltage ΔVBL that a sense amplifier senses between two complementary read bit lines in an array using memory cell 31 would be about Vtn, the threshold voltage for an NMOS transistor. This sensed voltage is greater than the very small differential voltage sensed in conventional DRAMs.

The read of the zero also does not change the state of the capacitor C so that restore cycle can be saved. The elimination of the restore requirement is one of the features that are achieved by embodiments of the present invention. The 2T1C cells can retain data for long periods, and because the cell is read by a transistor and not by a charge sharing process as in prior art DRAM cells, data is retained in the cell during reads. FIG. 7, discussed below, illustrates retention times for some example embodiments.

In addition, the read bit line RBL does not receive the output of the memory cell 31 via charge sharing, as in the prior art, but instead is actively driven by transistor N2. Transistor N2 can rapidly drive the read bit line RBL and local sense amplifiers can be saved. Instead, the latching amplifier that sits on the global bit lines may be driven directly by the memory cell 31. This feature of the embodiments means that although the area for each cell is slightly increased by the extra cell transistor, the need for local bit lines and local sense amplifiers is reduced, so the silicon area penalty is not significant. The access time is faster as the bit lines are driven to receive the stored voltage delta V, instead of using the slow charge sharing process of the conventional DRAM cell.

The following table summarizes the voltages placed on each of the control lines and the ON/OFF status of N1, and N2, for each operation described above.

TABLE 1

Write 1: N1 turn on; RWL GND & RBL Floating, and C is charging.
Hold state (Write): WWL GND & RWL GND.
Read 1: N1 turn off; N2 turn on; and the RBL charges to VDD.
Hold state(Read): WWL GND; RWL FLOATING.
Write 0: N1 turn on(=>N2 turn off); RWL GND, and C discharges to 0.
Read 0: N1 turn off; N2 turn on; and the RBL charging to VDD-VT*

*(Note: If the storage capacitor coupling ratio is 100%).

Figure 4:
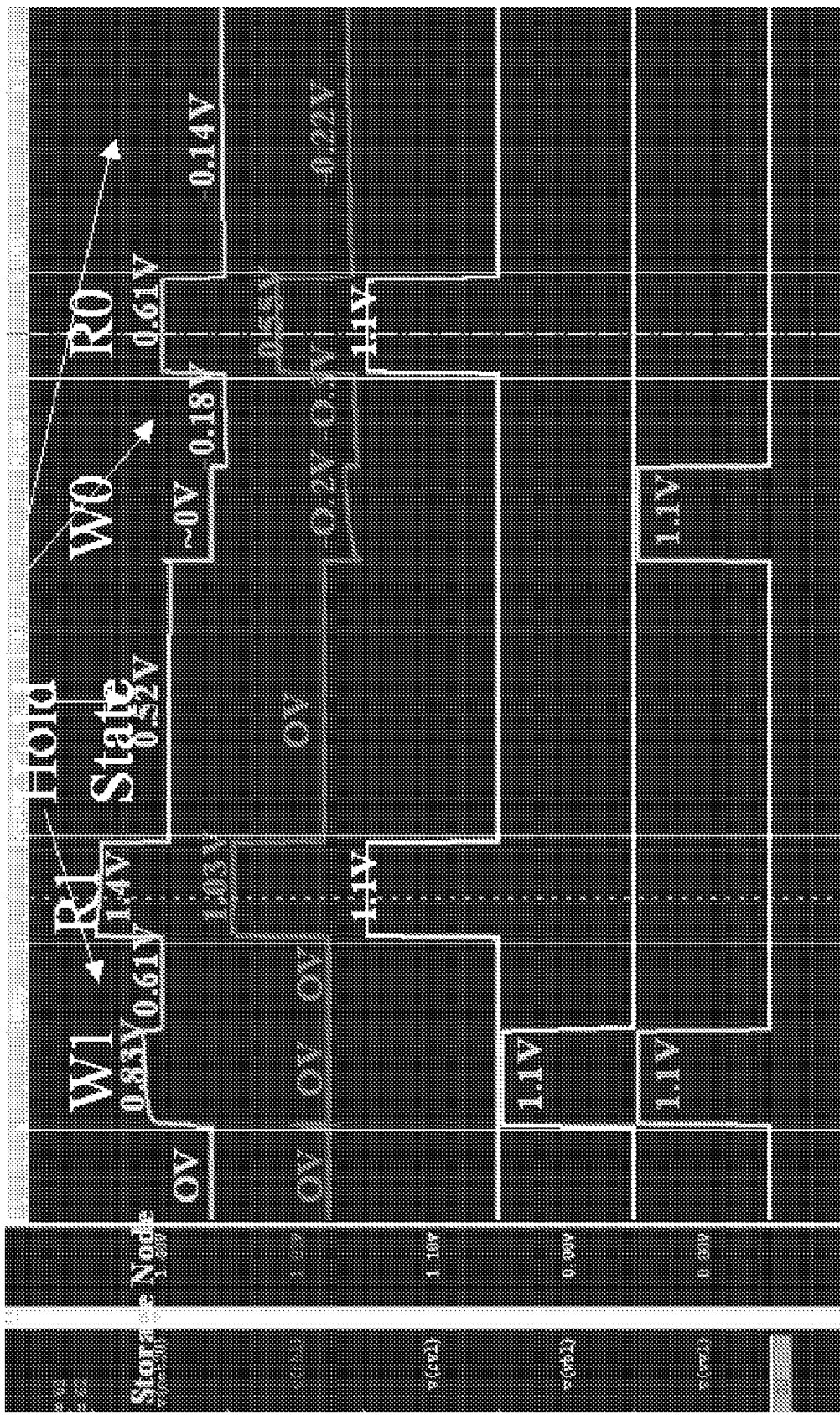
FIG. 4 illustrates a circuit timing simulation of the memory cell of FIG. 3.

FIG. 4 depicts illustrative circuit simulation timing results obtained for an example 2T1C memory cell of the exemplary embodiment of FIG. 3, implemented in a 45 nanometer semiconductor process technology. VDD is chosen to be about 1.1 Volts.

In FIG. 4, the top trace depicts the voltage at the storage node SN, labeled "Storage Node". The next trace down from the top of FIG. 4 depicts the voltage on the read bit line RBL, labeled v(rbl). The next trace down from the top depicts the voltage on the read word line RWL, labeled v(rwl). The next trace down from the top depicts the voltage on the write bit line WBL, labeled v(wbl). The bottom trace depicts the voltage on the write word line WWL, labeled v(wwl). The operations from left to right in the timing waveform are a write "1", labeled W1, a Hold state, a read "1', labeled R1, another hold state, a write "0", labeled W0, another hold state, and a read "0", labeled R0 followed by a final hold state.

As can be seen from the waveform illustrating the circuit simulation results, during a write 1 cycle W1, the storage node is raised to a voltage 0.83V. During the hold cycle that follows, this node is 0.61V. During a read "1" cycle, the storage node is raised to 1.4V by the voltage applied to the read word line RWL and the boost voltage from the storage capacitor. This boost voltage turns on transistor N2 (see FIG. 3) quite hard and so the read bit line RBL receives 1.03 Volts.

During the write "0" W0 operation, the storage node SN voltage is lowered to 0 volts by discharging through transistor N1 (see FIG. 3) to the VSS level on the write bit line WBL, which is shown in the next trace up from the bottom. During the read "0" R0 operation, the storage node voltage becomes 0.61 Volts. The read word line RWL has voltage VDD on it, but the read bit line RBL only has 0.55 Volts on it. Thus, the "0" voltage that is placed on the bit line for a "0" read is about 0.48V less than the "1" read voltage. This means there is 480 millivolts available for ΔVBL sensing on a pair of read bit lines in a memory array formed using the 2T1C cells of the exemplary embodiment of the present invention. A sense amplifier placed in a memory array embodiment of these cells thus has over twice the ΔVBL differential voltage at its input, as compared to the typical 200 millivolts ΔVBL of the prior art memory cell array. Also, as a further benefit of the use of the exemplary embodiments, the voltage on the read bit line voltage RBL is supplied by a driving transistor, N2, not a charge sharing memory cell capacitor. As can be seen in the trace, the line RBL is immediately switched to its full level; therefore a much faster memory cell access results.

The storage capacitor is never directly coupled to the output bit line RBL, and the capacitor can have storage node coupling voltage. This feature of the embodiments is important so that the memory cell can endure more leakage. Also, the circuit can easily make the ΔVt differentiation between the data 1 and data 0. If the storage coupling ratio is 100%, the circuit can endure about Vdd−2vt leakage. The data retention of the exemplary embodiment memory cell is lengthened. As shown in FIG. 7, for typical capacitor sizes and VDD levels, the retention time is about 1 millisecond for 1 to 3 femtofarad (ff) capacitor sizes. Further the read operation does not change the state of the memory cell, so that a restore cycle is not needed at the end of a read cycle, further speeding total time spent in the memory access cycle.

Figure 5:
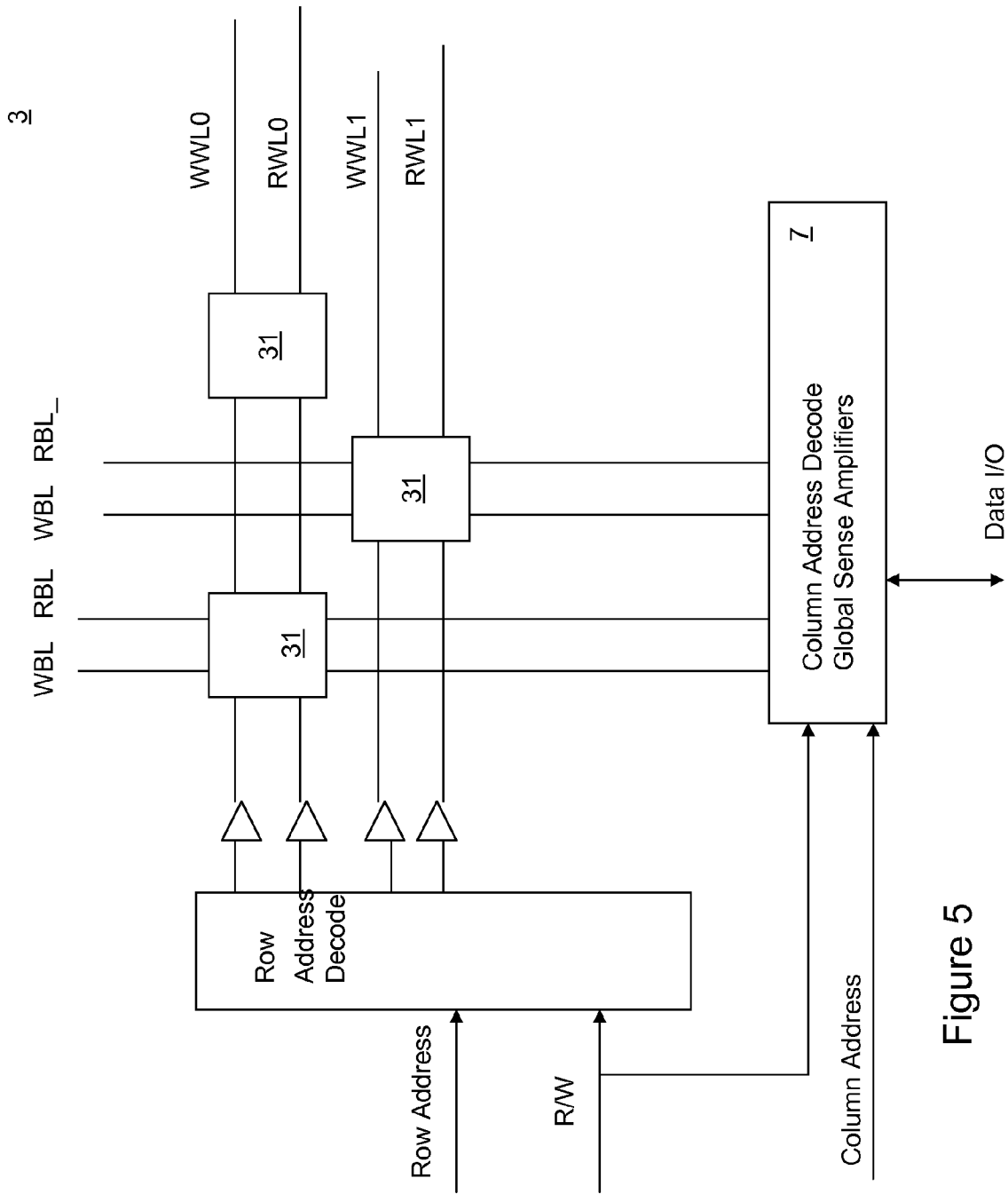
FIG. 5 is a dynamic memory embodiment formed of the memory cells of FIG. 3.

FIG. 5 depicts, in a block diagram, an exemplary embodiment of a memory array formed of the dynamic memory cells 31 of FIG. 3. As is known in the art, memory arrays can contain many thousands and even millions of memory cells, and are often arranged in sub-arrays. Sub-array partitioning is typically accomplished using some shared circuitry and select circuitry to select which sub-array of memory cells is accessed in a given cycle. For simplicity, only a portion of the memory array is shown in FIG. 5, memory sizes are typically much larger and vary from a few thousand cells to 64M and 128M DRAM arrays, and even higher numbers of cells are envisioned.

In FIG. 5, a non-limiting illustrative example circuit array of memory cells 31 is shown in rows and columns (only 3 cells are shown, but there is a cell at each row, column intersection). Each memory cell is coupled to four control lines as shown in FIG. 3, a read word line RWL, a read bit line RBL, a write word line WWL, and a write bit line WBL. The bit lines are arranged in pairs and the bit lines are usually described as BL, BL_ or bit line, bit line "bar" for the complementary line. Because differential sensing is used, whenever a cell is addressed and read, the bit line voltage is compared to a second bit line that is not active so that the ΔVBL voltage is properly sensed. In this example, read bit lines RBL and RBL_ will form a pair of complementary bit lines for sensing by a latching sense amplifier located in the output and column logic circuit 7. Address information is input to the array and as is known in the memory art, a row address portion and a column address portion are coupled to a row address decode 9 that outputs the word lines RWL and WWL, the column address portion is routed to the column logic circuit 7 and decoded. Address decoding is well known and not further described here.

The read write input is also used by both the row and column address decodes 7 and 9. Unlike the prior art, a pair of word lines is routed to each memory cell. Also, a pair of bit lines is routed to each memory cell. This extra routing will add some area requirements to the array as compared to the prior art approaches, however because the read bit lines RBL are actively driven, there is no need for local bit lines and local sense amplifiers as in the prior art, so the layout may be similar to the area requirements of 1T1C memory cell arrays.

The circuit of FIG. 5, array 3, may be disposed on a dedicated integrated circuit to form a commodity DRAM product of high speed. This exemplary embodiment may also be used to form memory cards such as DIMM and SIMM cards with high speed memory access.

Figure 6:
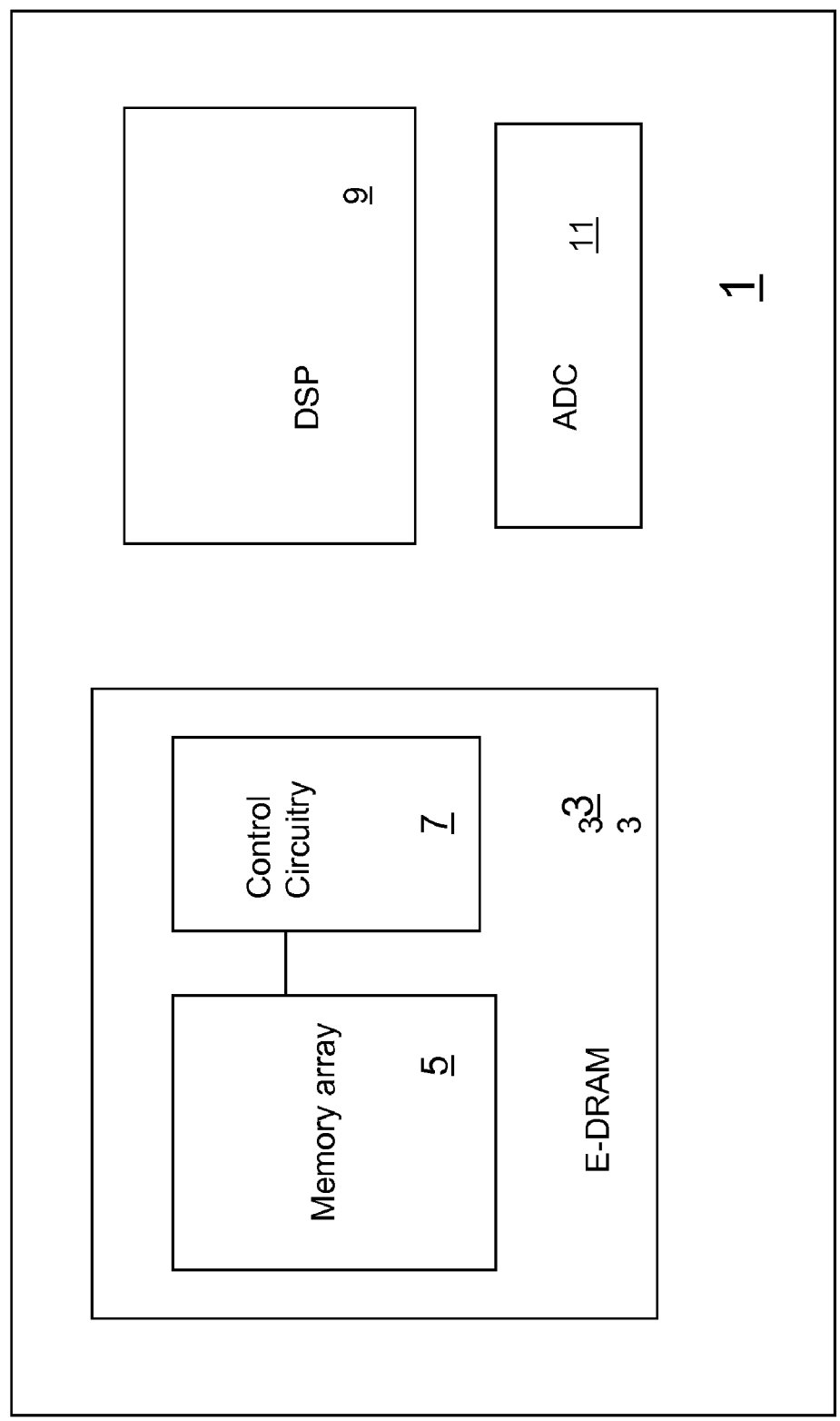
FIG. 6 depicts in a simplified block diagram a preferred embodiment integrated circuit including an embedded DRAM array of the memory cells of FIG. 3.

Another important feature of the memory cell 31 of FIG. 3 is the use of the high speed memory cell in an embedded DRAM array. FIG. 6 depicts, in a simplified block diagram form, an SOC integrated circuit 1 that includes, among other circuits, an embedded DRAM 3 has cell array 5 including the 2T1C memory cells 31 of FIG. 3, bit line and sense amplifier circuitry in a control circuit 7 coupled to the memory array. Additional circuitry such as, for illustrative and non limiting examples, DSP 9 and analog to digital converter (ADC) 11 may be included on integrated circuit 1, and the DSP may be programmed to implement any of a number of known, or desired, functions such as cell phones, PDAs, MP3 audio or video players, cameras, and the like. The E-DRAM array 3 may be provided in a library of core functions that may be selected by a so-called "fabless" circuit designer, using known ASIC or semi custom design tools to complete the design for an integrated circuit that can be manufactured by a semiconductor foundry. Such preferred embodiment devices, which may be referred to as SOCs or SOICs, may be designed and verified in their operation using automated simulation, layout and design tools and techniques as are well known to those skilled in the relevant arts.

FIG. 7 depicts data retention results for example cells in the 45 nanometer process node simulated using capacitors of values 0.5, 1, 2 and 3 femtofarads. In FIG. 7, the first set of four columns depicts the voltage at the storage node in a hold state at times 20, 140, 400 and 999990 nanoseconds (approximately 1 millisecond) after a write. Since the storage node voltage for the capacitor only needs to remain above 1 Vt to operate, if the storage node voltage remains above 1 Vt for the time required, no restore operation is indicated. As shown in the table, for the 1.5 ff case, the lowest storage node voltage is greater than 400 millivolts, and so this capacitor exceeds the requirement needed to eliminate the restore requirement entirely, also the larger capacitors do as well. The read state results for two different times are illustrated in the last two columns. For reads the times 507.7 ns and 1 millisecond. These simulation results show that the embodiments of the 2T1C cell have excellent data retention even with small capacitors, and that the read does not eliminate stored charge in the capacitor, as the second transistor actively drives the read bit lines.

The preferred embodiment 2T1C memory cells described above provide several advantages when used in an embedded DRAM array. The use of the preferred embodiments allows fast memory access with excellent data retention and therefore, infrequent refresh cycles. The fact the memory cells of the exemplary embodiments can directly drive the global data bus eliminates the routing and local sense amplifier transistors used in the prior art, which further reduces the silicon area required. The greater differential voltage that is shown to be over 400 millivolts in the 45 nanometer technology node allows faster sensing and shorter access times. This provides improved I/O path speeds over conventional DRAM memory cells with local sense amplifier and local to global bit line coupling circuits. The exemplary embodiment 2T1C memory cell provides advantages at all semiconductor technology nodes. The use of the 2T1C memory cell and the relatively small storage capacitors also eliminates a mask step needed in the semiconductor process, as compared to the complex steps needed to form the larger value storage capacitors for DRAM cells of the prior art.

Although the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A memory cell, comprising:
   a write access transistor coupled between a storage node and a write bit line, and active during a write cycle responsive to a voltage on a write word line;
   a read access transistor coupled between a read word line and a read bit line, and active during a read cycle responsive to a voltage at the storage node; and
   a storage capacitor coupled between the read word line and the storage node, the storage capacitor having a capacitance value between 1.5 femtofarads and 3.0 femtofarads.

2. The memory cell of claim 1, wherein the write word line is coupled to a high voltage to store a charge representative of a data value in the storage capacitor.

3. The memory cell of claim 2, wherein the write access transistor has a gate terminal coupled to the write word line.

4. The memory cell of claim 2, wherein a charge representative of a "1" is stored in the storage capacitor by coupling the write bit line to a high voltage during a write cycle.

5. The memory cell of claim 2, wherein a charge representative of "0" is stored in the storage capacitor by coupling the write bit line to a low voltage during a write cycle.

6. The memory cell of claim 1, wherein when a high voltage is placed on the read word line, a voltage representative of a stored data value is placed on the read bit line by the read access transistor.

7. The memory cell of claim 6, wherein when the voltage representative of the stored data value is representative of a "1" during a read cycle, a first voltage is placed on the read bit line and when the voltage representative of the stored data value is representative of a "0", a second voltage is placed on the read bit line.

8. The memory cell of claim 6, wherein during a read cycle a voltage at a gate of the read access transistor is a read word line voltage boosted by a voltage from the storage capacitor.

9. The memory cell of claim 7, wherein a difference between the first voltage and the second voltage corresponds to a threshold voltage drop of the read access transistor.

10. The memory cell of claim 1 wherein the read bit line is driven by the read access transistor during read cycles.

11. A dynamic memory array, comprising:
    a plurality of dynamic memory cells arranged in rows and columns, each dynamic memory cell coupled to a respective read word line, a respective read bit line, a respective write word line, and a respective write bit line, and each dynamic memory cell further comprising:
    a write access transistor coupled between a storage node and a write bit line, and active during a write cycle responsive to a voltage on a write word line;
    a read access transistor coupled between a read word line and a read bit line, and active during a read cycle responsive to a voltage at the storage node; and
    a storage capacitor coupled between the read word line and the storage node, the storage capacitor having a capacitance value between 1.5 femtofarads and 3.0 femtofarads.

12. The dynamic memory array of claim 11, wherein the write word line is coupled to a high voltage to store a charge representative of a data value in the storage capacitor.

13. The dynamic memory array of claim 12, wherein the write access transistor has a gate terminal coupled to the write word line.

14. The dynamic memory array of claim 12, wherein a charge representative of a "1" is stored in the storage capacitor by coupling the write bit line to a high voltage during a write cycle.

15. The dynamic memory array of claim 12, wherein a charge representative of "0" is stored in the storage capacitor by coupling the write bit line to a low voltage during a write cycle.

16. The dynamic memory array of claim 11, wherein when a high voltage is placed on the read word line during a read cycle, a voltage representative of a stored data value is placed on the read bit line by the read access transistor.

17. The dynamic memory array of claim 16, wherein when the voltage representative of the stored data value is representative of a "1" during a read cycle, a first voltage is placed on the read bit line, and when the voltage representative of the stored data value is representative of a "0", a second voltage is placed on the read bit line.

18. The dynamic memory array of claim 16, wherein during a read cycle a voltage at a gate of the read access transistor is a read word line voltage boosted by a voltage from the storage capacitor.

19. The dynamic memory array of claim 17, wherein a difference between the first voltage and the second voltage corresponds to a threshold voltage drop of the read access transistor.

20. The dynamic memory array of claim 11 wherein the read bit line is driven by the read access transistor during read cycles.

* * * * *